US012160965B2

(12) United States Patent
Feng

(10) Patent No.: US 12,160,965 B2
(45) Date of Patent: Dec. 3, 2024

(54) SUPPORT STRUCTURE, DISPLAY ASSEMBLY, AND ELECTRONIC DEVICE

(71) Applicant: ViVO MOBILE COMMUNICATION CO., LTD., Guangdong (CN)

(72) Inventor: Anming Feng, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 175 days.

(21) Appl. No.: 17/966,290

(22) Filed: Oct. 14, 2022

(65) Prior Publication Data

US 2023/0032983 A1 Feb. 2, 2023

Related U.S. Application Data

(63) Continuation of application No. PCT/CN2021/089380, filed on Apr. 23, 2021.

(30) Foreign Application Priority Data

Apr. 23, 2020 (CN) .......................... 202010328293.1

(51) Int. Cl.
*H05K 5/02* (2006.01)
*F16C 11/04* (2006.01)
(Continued)

(52) U.S. Cl.
CPC ............ *H05K 5/0226* (2013.01); *F16C 11/04* (2013.01); *G06F 1/1681* (2013.01); *E05D 3/122* (2013.01); *E05Y 2999/00* (2024.05)

(58) Field of Classification Search
CPC ...................................................... H05K 7/00
See application file for complete search history.

(56) References Cited

U.S. PATENT DOCUMENTS 10,491,725 B1 11/2019 Harmon et al.
2015/0013107 A1 1/2015 Shin et al.
(Continued)

FOREIGN PATENT DOCUMENTS

CN 106205385 A 12/2016
CN 206619066 U 11/2017
(Continued)

OTHER PUBLICATIONS

International Patent Application No. PCT/CN2021/089380, International Search Report and Written Opinion with Partial English Translation mailed Jun. 22, 2021, 9 pages.
(Continued)

*Primary Examiner* — Jerry Wu
(74) *Attorney, Agent, or Firm* — Fredrikson & Byron, P.A.

(57) ABSTRACT

A support structure is provided, which includes a first support having a first supporting surface, a second support having a second supporting surface, and a third support having a third supporting surface. The first support is provided with a first connecting portion. The second support rotatably fits with the first support about an axis of rotation. The second support is provided with a second connecting portion. The first connecting portion and the second connecting portion are both spaced apart from the axis of rotation. The third support is rotatably connected to both the first connecting portion and the second connecting portion. When the support structure is in a folded state, the first supporting surface and the second supporting surface are spaced apart from the third supporting surface, and the first supporting surface and the second supporting surface each form a specific included angle with the third supporting surface.

14 Claims, 8 Drawing Sheets

(51) Int. Cl.
*G06F 1/16* (2006.01)
*E05D 3/12* (2006.01)

(56) References Cited

U.S. PATENT DOCUMENTS

| | | | |
|---|---|---|---|
| 2015/0366089 A1* | 12/2015 | Park | H04M 1/0268 |
| | | | 361/679.01 |
| 2016/0085265 A1 | 3/2016 | Park et al. | |
| 2019/0174645 A1 | 6/2019 | Jeon et al. | |

FOREIGN PATENT DOCUMENTS

| | | |
|---|---|---|
| CN | 108055371 A | 5/2018 |
| CN | 207777905 U | 8/2018 |
| CN | 109637377 A | 4/2019 |
| CN | 109669513 A | 4/2019 |
| CN | 109780403 A | 5/2019 |
| CN | 209710124 U | 11/2019 |
| CN | 110599907 A | 12/2019 |
| CN | 210041894 U | 2/2020 |
| CN | 210201872 U | 3/2020 |
| CN | 111009192 A | 4/2020 |
| KR | 1020160121350 A | 10/2016 |
| KR | 1020190001864 A | 1/2019 |

OTHER PUBLICATIONS

European Patent Office "Extended European Search Report" From Application No. 21791591.7, Dated-13 20-2023, pp. 1-7.

* cited by examiner

SUPPORT STRUCTURE, DISPLAY ASSEMBLY, AND ELECTRONIC DEVICE

CROSS-REFERENCE

This application is a continuation of International Application No. PCT/CN2021/089380, filed on Apr. 23, 2021, which claims priority to Chinese Patent Application No. 202010328293.1, filed on Apr. 23, 2020 in China, and entitled "SUPPORT STRUCTURE, DISPLAY ASSEMBLY, AND ELECTRONIC DEVICE", which is incorporated herein by reference in its entirety.

TECHNICAL FIELD

The present disclosure relates to the technical field of communication devices, and in particular, to a support structure, a display assembly, and an electronic device.

BACKGROUND

With the advancement of science and technology, the use of a flexible display allows an electronic device to be portable while having a larger display area. Depending on different needs, the electronic device can be folded for better portability, or unfolded for a larger display area. However, abnormal expansion and contraction may occur in the process of switching between an unfolded state and a folded state of the flexible display of the electronic device, which in turn causes a surface of the flexible display of the electronic device to be creased when being folded.

SUMMARY

According to a first aspect of the present disclosure, a support structure, applied to a flexible display, is provided. The support structure includes:

a first support having a first supporting surface and provided with a first connecting portion;

a second support rotatably fitting with the first support about an axis of rotation, where the second support has a second supporting surface and is provided with a second connecting portion, and the first connecting portion and the second connecting portion are both spaced apart from the axis of rotation; and a third support having a third supporting surface and rotatably connected to both the first connecting portion and the second connecting portion, in a case that the support structure is in a folded state, the first supporting surface and the second supporting surface are spaced apart from the third supporting surface, and the first supporting surface and the second supporting surface each form a specific included angle with the third supporting surface.

According to a second aspect of the present disclosure, a display assembly is provided, which includes a flexible display and the foregoing support structure. The flexible display is mounted onto the support structure, and part of the flexible display is fixedly connected to the third support.

According to a third aspect of the present disclosure, an electronic device is provided, which includes the foregoing display assembly.

BRIEF DESCRIPTION OF DRAWINGS

The accompanying drawings described herein are intended for a better understanding of the present disclosure and constitute a part of the present disclosure. Example embodiments of the present disclosure and descriptions thereof are intended to explain the present disclosure, but do not constitute any inappropriate limitation on the present disclosure. In the accompanying drawings.

REFERENCE SIGNS

- 100: first support, 110: first connecting portion, 120: first gear teeth, 130: first supporting rod, 140: second supporting rod, 150: first supporting plate, 160: first housing, 170: first supporting portion, 180: first limiting groove;
- 200: second support, 210: second connecting portion, 220: second gear teeth, 230: third supporting rod, 240: fourth supporting rod, 250: second supporting plate, 260: second housing, 270: second supporting portion, 280: second limiting groove;
- 300: third support, 310: first slot for moving, 320: second slot for moving;
- 400: end cover, 410: first rotating shaft, 420: second rotating shaft;
- 500: base, 510: main body portion, 520: first limiting portion, 530: second limiting portion, 540: third limiting portion; and
- 600: flexible display.

DESCRIPTION OF EMBODIMENTS

To make the objectives, technical solutions, and advantages of the present disclosure clearer, the following clearly describes the technical solutions of the present disclosure with reference to the specific embodiments of the present disclosure and the corresponding accompanying drawings. Apparently, the described embodiments are merely some rather than all of the embodiments of the present disclosure.

All other embodiments obtained by persons of ordinary skill in the art based on the embodiments of the present disclosure without creative efforts shall fall within the scope of protection of the present disclosure.

The technical solutions disclosed in the embodiments of the present disclosure are described in detail below with reference to the accompanying drawings.

Figure 1:
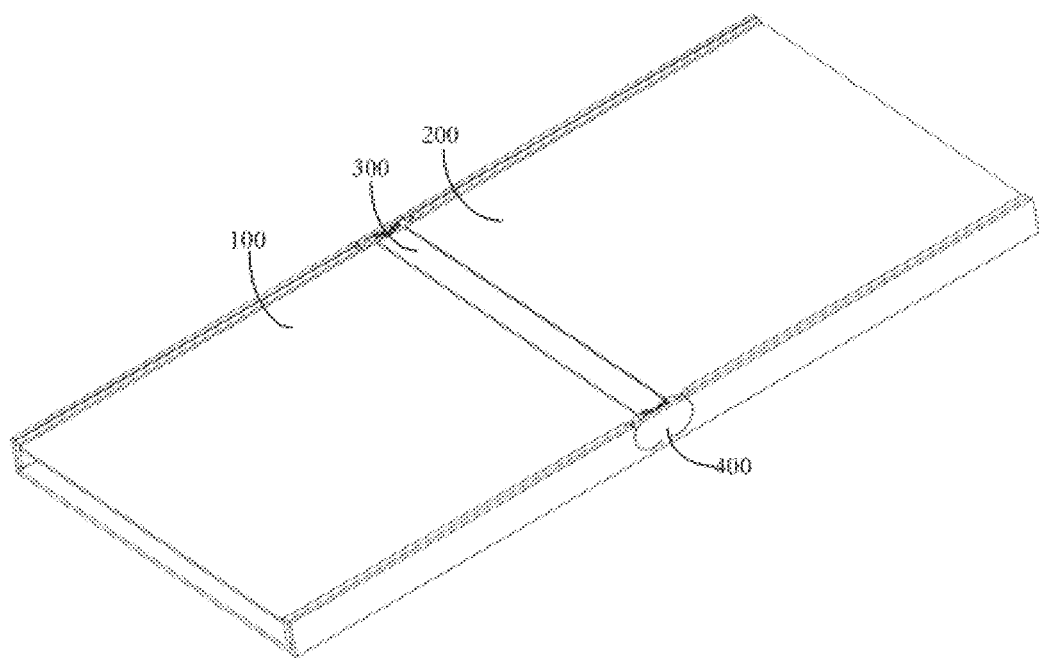
FIG. 1 is a schematic structural diagram of a support structure in an unfolded state according to an embodiment of the present disclosure.
Figure 2:
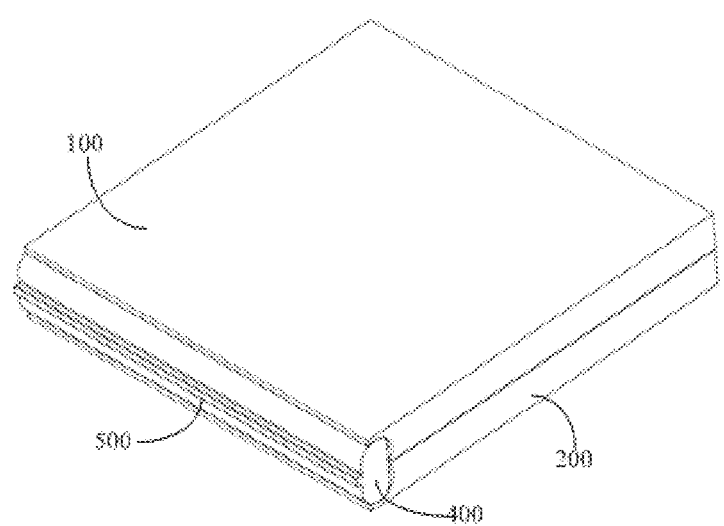
FIG. 2 is a schematic structural diagram of a support structure in a folded state according to an embodiment of the present disclosure.
Figure 3:
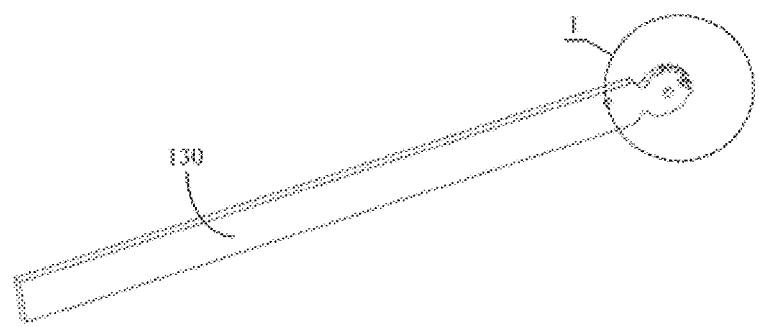
FIG. 3 is a schematic structural diagram of a first supporting rod in a support structure according to an embodiment of the present disclosure.
Figure 4:
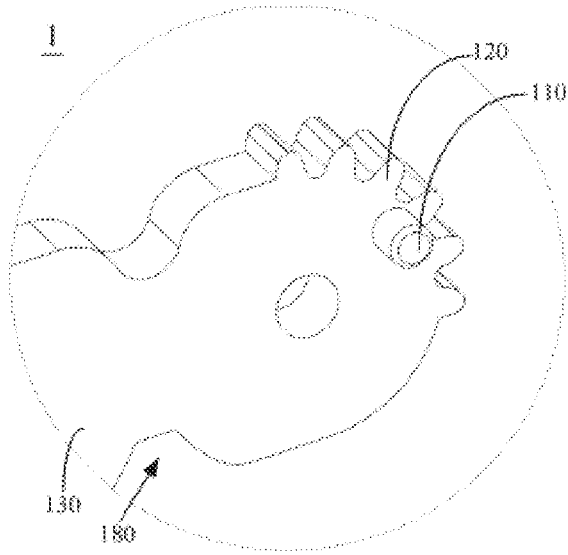
FIG. 4 is an enlarged view of part I in FIG. 3.
Figure 5:
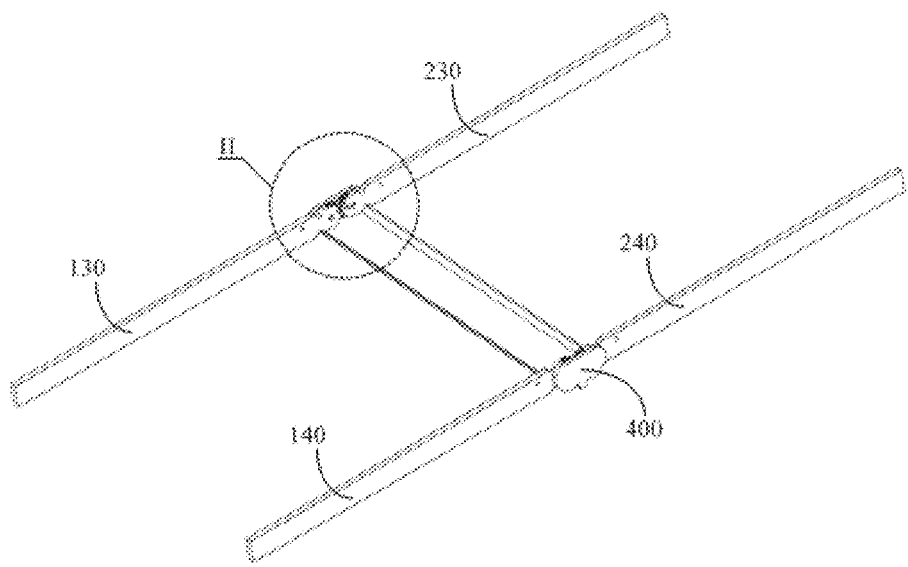
FIG. 5 is a schematic structural diagram of a support structure in an assembly process according to an embodiment of the present disclosure.
Figure 6:
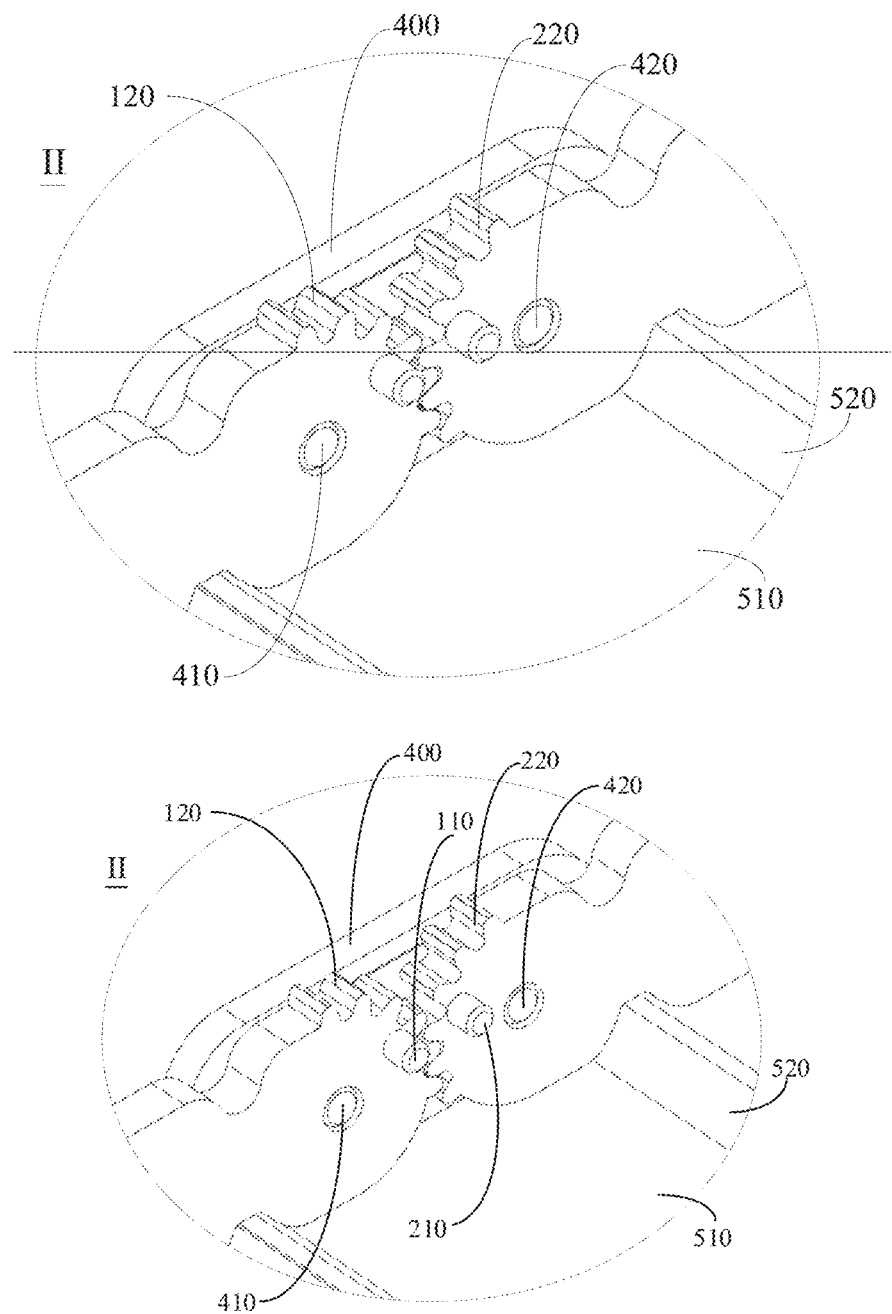
FIG. 6 is an enlarged view of part II in FIG. 5.
Figure 7:
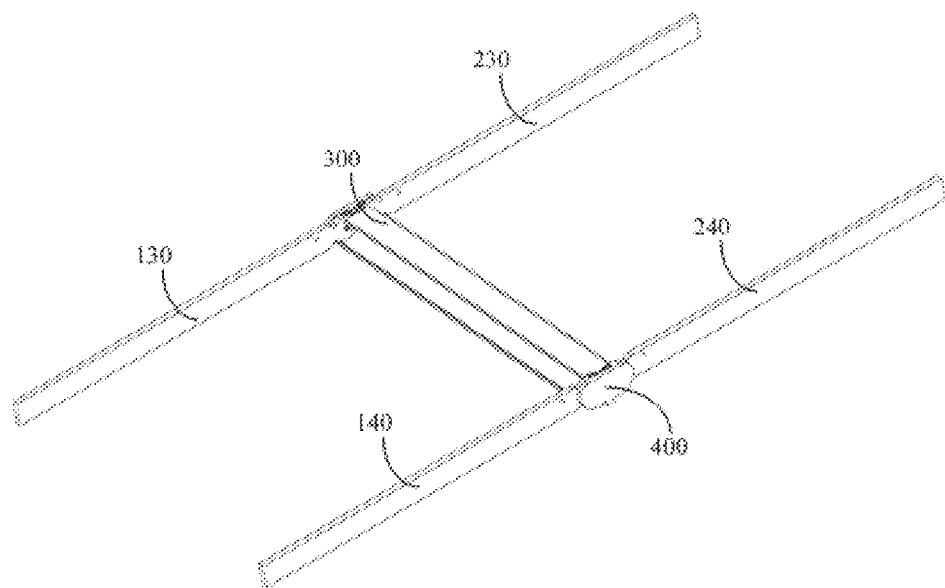
FIG. 7 is another schematic structural diagram of a support structure in an assembly process according to an embodiment of the present disclosure.
Figure 8:
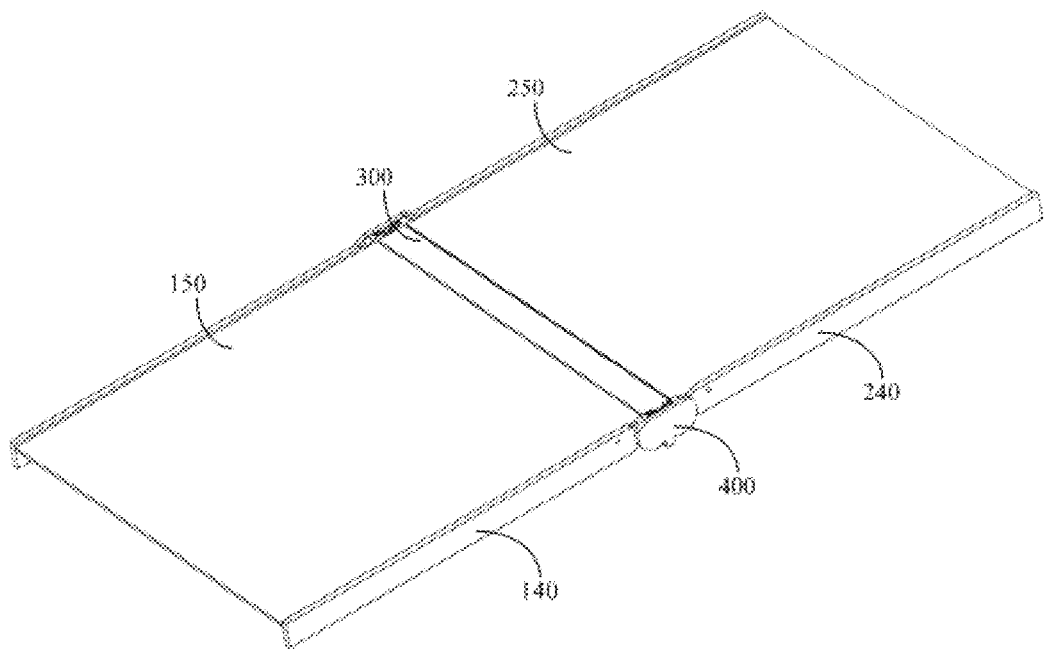
FIG. 8 is still another schematic structural diagram of a support structure in an assembly process according to an embodiment of the present disclosure.
Figure 9:
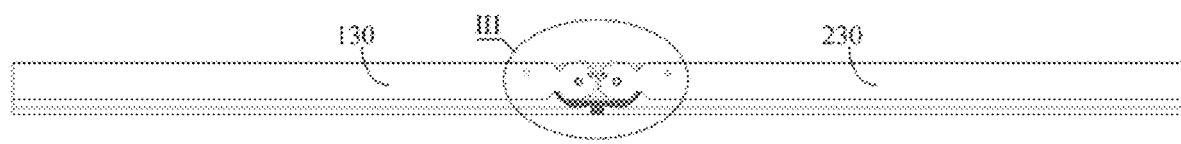
FIG. 9 is a schematic diagram of part of a support structure in an unfolded state according to an embodiment of the present disclosure.
Figure 10:
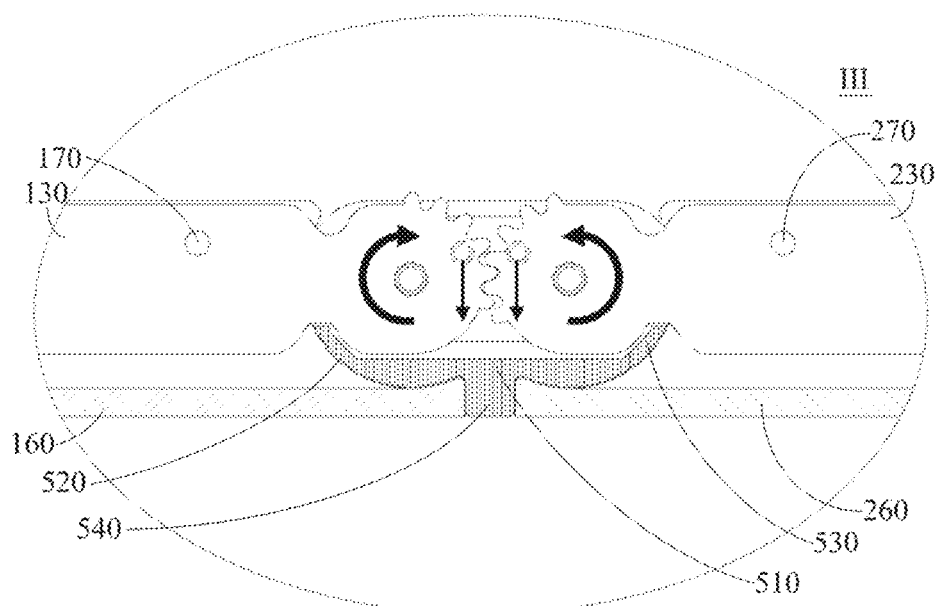
FIG. 10 is an enlarged view of part III in FIG. 9.
Figure 10:
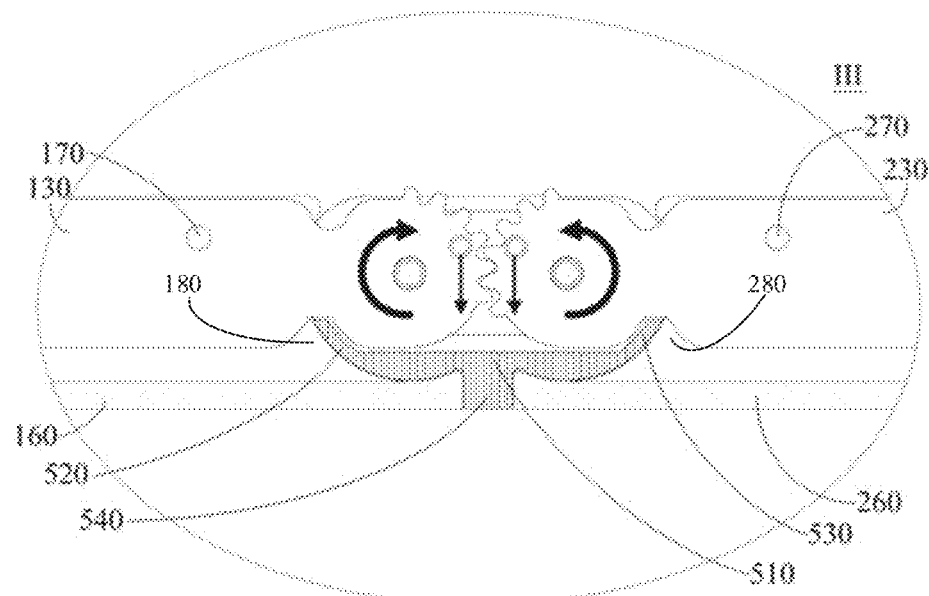
Figure 11:
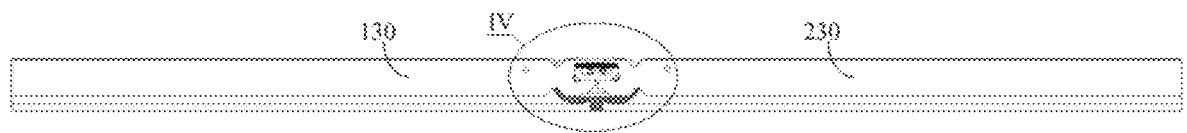
FIG. 11 is a schematic diagram of a support structure in an unfolded state according to an embodiment of the present disclosure.

As shown in FIG. 1 to FIG. 14, an embodiment of the present disclosure discloses a support structure, which can be applied to an electronic device to support a flexible display 600. As shown in FIG. 1, the support structure includes a first support 100, a second support 200, and a third support 300.

The first support 100 has a first supporting surface, and the first support 100 is provided with a first connecting portion 110. The second support 200 and the first support 100 are rotatable relative to each other about an axis of rotation. The second support 200 has a second supporting surface and is provided with a second connecting portion 210. The first connecting portion 110 and the second connecting portion 210 are both spaced apart from the axis of rotation. It should be noted that the axis of rotation is a virtual rotating shaft, which may be located on the first support 100 and/or the second support 200, or may be located outside the first support 100 and the second support 200.

Alternatively, the first support 100 and the second support 200 may be spaced apart from each other, and both the first support 100 and the second support 200 can be mounted onto a mounting base such as a housing, so that the first support 100 and the second support 200 are both rotatable relative to the housing. Alternatively, the first support 100 and the second support 200 may be connected to each other, and the first support 100 is rotatable relative to the second support 200 about the axis of rotation.

It should be noted that structures of the first support 100 and the second support 200 may be the same or different. In the present disclosure, the structures of the first support 100 and the second support 200 being the same is used as an example. The structures of the first support and the second support being the same facilitates processing and assembling of the support structure. The first connecting portion 110 and the first support 100 may be formed integrally, and the second connecting portion 210 and the second support 200 may also be formed integrally.

The third support 300 has a third supporting surface, and the third support 300 is rotatably mounted onto the first connecting portion 110 and the second connecting portion 210. To ensure that the support structure has relatively high structural strength, the first support 100, the first connecting portion 110, the second support 200, the second connecting portion 210, and the third support 300 can all be made of hard materials such as metal.

During use of the support structure, a display screen including the flexible display 600 can be supported on the first supporting surface, the second supporting surface, and the third supporting surface. Alternatively, the display screen may be an integral flexible display 600, and in this case, the flexible display 600 may be supported on the first supporting surface, the second supporting surface, and the third supporting surface at the same time. In some other embodiments of the present disclosure, alternatively, the display screen may include the flexible display 600, a first rigid display, and a second rigid display, and the first rigid display and the second rigid display may be connected to two opposite sides of the flexible display 600 respectively to form the entire display screen. In this case, the first rigid display may be supported on the first supporting surface, the second rigid display may be supported on the second supporting surface, and the flexible display 600 may be supported on the third supporting surface.

The support structure has an unfolded state and a folded state. In a case that the support structure is in an unfolded state, as described above, the display screen including the flexible display 600 can be supported on the first supporting surface, the second supporting surface, and the third supporting surface, so that the support structure can provide reliable support for the flexible display.

In a case that the support structure is in a folded state, the first supporting surface and the second supporting surface each form a specific included angle with the third supporting surface to ensure that the support structure is in a folded state and improve portability of the support structure and the electronic device. In addition, in a case that the support structure is in a folded state, the third support 300 is located between the first support 100 and the second support 200, and the first supporting surface and the second supporting surface are both spaced apart from the third supporting surface, that is, there are preset distances between the first supporting surface and the third supporting surface, and between the second supporting surface and the third supporting surface. In this way, in the process of folding the first support 100 and the second support 200 toward each other, a space between the first supporting surface and the third supporting surface and a space between the second supporting surface and the third supporting surface can both be used as an accommodating space to provide accommodation for a component such as the flexible display located on the inner side of the electronic device, preventing the flexible display from being creased in the process of being folded.

Alternatively, in the process of folding the flexible display 600 along with the support structure, part of the flexible display 600 corresponding to the space between the first supporting surface and the third supporting surface can extend into the space between the first supporting surface and the third supporting surface through deformation. The foregoing space can accommodate part of the structure of the flexible display 600, thereby preventing the flexible display 600 from being creased in the process of being folded. Similarly, the space between the second supporting surface and the third supporting surface can also provide accommodation for the flexible display 600, and the spaces on two opposite sides of the third supporting surface each are used as an accommodating space for the flexible display 600 to disperse a bending stress in a region where the flexible display 600 is bent, so as to prevent the flexible display 600 from being easily damaged due to a large folding angle in the process of being folded.

In addition, in a case that the support structure is in a folded state, the first supporting surface and the second supporting surface are arranged facing each other. In other words, when the first supporting surface and the second supporting surface are located between the first support and the second support, the flexible display of the electronic device is located between the first support and the second support, so that the first support and the second support can provide protection for the flexible display, preventing damage to the flexible display when the electronic device is bumped or dropped.

Optionally, in a case that the support structure is in an unfolded state, the first supporting surface, the second supporting surface, and the third supporting surface can be coplanar. In this way, the first support 100, the third support 300, and the second support 200 can provide better support for the display screen. In addition, with the foregoing solution, in a case that the support structure is in an unfolded state, the flexible display 600 supported on the third support 300 can be flatter, which can improve a display effect to some extent.

Alternatively, the first support 100, the third support 300, and the second support 200 may be plate-like structural members, or all the three may include plate-like structural members. The plate-like structural members each have at least one flat surface as the first supporting surface, the third supporting surface, or the second supporting surface. When the first support 100 and the second support 200 are rotated 180° relative to each other, that is, when the first support and the second support are rotated until the support structure is in an unfolded state, the first supporting surface, the third supporting surface, and the second supporting surface can be coplanar.

As described above, both the first support 100 and the second support 200 may be mounted onto a mounting base such as a housing, and in this case, the first support 100 and the second support 200 may be spaced apart from each other. Then, the first connecting portion 110 may be disposed at an end of the first support 100 close to the second support 200, and correspondingly, the second connecting portion 210 may be disposed at an end of the second support 200 close to the first support 100. In this case, the third support 300 may be located between the first support 100 and the second support 200.

In another embodiment of the present disclosure, the first support 100 and the second support 200 may be connected to each other. In this case, the third support 300 may be disposed in a region enclosed by the first support 100 and the second support 200. In other words, in the direction of the axis of rotation, the third support 300 is located inside the first support 100.

Optionally, an outer edge of the first support 100 is provided with a plurality of first gear teeth 120, an outer edge of the second support 200 is provided with a plurality of second gear teeth 220, and the first support 100 rotatably fits with the second support 200 via engagement of the first gear teeth 120 and the second gear teeth 220. Therefore, when the first support 100 is rotated alone, the second support 200 can be rotated accordingly via the engagement of the first gear teeth 120 and the second gear teeth 220. In this way, a user can fold or unfold the support structure only with a small angle of rotation during use of the support structure, which can also improve a response speed of the support structure.

Alternatively, parameters such as respective tooth widths of the first gear teeth 120 and the second gear teeth 220 may be determined depending on actual conditions, and it is ensured that the first gear teeth 120 and the second gear teeth 220 can engage with each other. To reduce the difficulty of processing, the first gear teeth 120 may be provided only on part of the outer edge of the first support 100, and correspondingly, the second gear teeth 220 may be provided only on part of the outer edge of the second support 200 corresponding to the first gear teeth 120.

With the foregoing technical solution, the first support 100 can fit with the second support 200 without using another component for mounting. After the first support 100 and the second support 200 are connected to each other via the flexible display 600, the engagement relationship between the first gear teeth 120 and the second gear teeth 220 can ensure that the first support 100 and the second support 200 can rotate relative to each other to complete the folding and unfolding actions of the support structure.

Optionally, as shown in FIG. 5 to FIG. 8, the first support 100 includes a first supporting rod 130, a second supporting rod 140, and a first supporting plate 150. The first supporting rod 130 is spaced apart from the second supporting rod 140. The first supporting rod 130 and the second supporting rod 140 are both provided with the first connecting portion 110. The first supporting rod 130 and the second supporting rod 140 are both connected to the first supporting plate 150. The first supporting plate 150 has the first supporting surface.

The first support 100 having the foregoing structure can provide stable support for the display screen, and the overall structure is simple and easy to assemble. In addition, a mounting space can be formed between the first supporting rod 130 and the second supporting rod 140 to provide an accommodating space for the mounting of other components in the electronic device.

As described above, a structure of the second support 200 may be the same as that of the first support 100. Alternatively, the second support 200 includes a third supporting rod 230, a fourth supporting rod 240, and a second supporting plate 250. The third supporting rod 230 is spaced apart from the fourth supporting rod 240. The third supporting rod 230 and the fourth supporting rod 240 are both provided with the second connecting portion 210. The third supporting rod 230 and the fourth supporting rod 240 are both connected to the second supporting plate 250. The second supporting plate 250 has the second supporting surface.

In addition, the first support 100 and the second support 200 may also be a plate-like structure as a whole, which can also ensure that the first support 100 and the second support 200 can provide support for the display screen and can both be connected to the third support 300. Certainly, the first support 100 and the second support 200 may also be other structures, which, for brevity, are not listed one by one herein.

Optionally, a side wall of at least one of the first supporting rod 130 and the second supporting rod 140 is provided with a first supporting portion 170, and the first supporting plate 150 is supported on the first supporting portion 170. The side walls of the first supporting rod or the second supporting rod refer to surfaces of the first supporting rod 130 and the second supporting rod 140 facing the other.

In a case that the side walls of the first supporting rod 130 and the second supporting rod 140 each are provided with the first supporting portion 170, at least two first supporting portions 170 can provide support for the first supporting plate 150 to ensure that the first supporting plate 150 can provide reliable support for the display screen. In addition, when the side walls of the first supporting rod 130 and the second supporting rod 140 each are provided with the first supporting portion 170, the display screen can be located between the first supporting rod 130 and the second supporting rod 140, so that the first supporting rod 130 and the second supporting rod 140 can provide some coating effect for the display screen, preventing the display screen from being damaged when the support structure mounted with the display screen is bumped. In addition, the display screen being located between the first supporting rod 130 and the second supporting rod 140 can also prevent the display screen from being exposed to cause leakage of electricity or scratch the user. The first supporting plate may be placed on the at least two first supporting portions, or the at least two first supporting portions may be inserted into corresponding grooves of the first supporting plate. The first supporting plate may be connected to the at least two first supporting portions by means of welding, bonding, or the like.

In other embodiments of the present disclosure, the first supporting portion 170 may be provided only on one of the first supporting rod 130 and the second supporting rod 140. In this case, stable and reliable support can be provided for the first supporting plate 150 by increasing a length of the first supporting portion 170. In this case, the first supporting plate may be disposed on the first supporting portion, and the first supporting plate is connected to the other supporting rod by means of bonding or welding. Alternatively, the first supporting portion may be embedded in a corresponding groove of the first supporting plate, and the first supporting plate overlaps with the other supporting rod, thereby ensuring stability of the first supporting plate.

Alternatively, the disposition of the first supporting portion 170 may be determined based on a thickness of the display screen that needs to be mounted. In a case that a side surface of the display screen is a curved surface, a distance between the first supporting portion 170 and the top surface of the first supporting rod 130 can be slightly less than the thickness of the display screen, so that a side of the display screen is exposed, preventing the first supporting rod 130 and the second supporting rod 140 from covering display content on the display screen, which can also improve overall aesthetics to some extent. In a case that the side surface of the display screen is a flat surface, the distance between the first supporting portion 170 and the top surface of the first supporting rod 130 can be equal to the thickness of the display screen, thereby ensuring that the display screen can be completely wrapped, and providing good protection for the display screen.

Correspondingly, a side wall of at least one of the third supporting rod 230 and the fourth supporting rod 240 of the second support 200 may be provided with a second supporting portion 270, and the second supporting plate 250 may be supported on the second supporting portion 270. A structure and a connection manner of the second supporting portion 270 in the second support 200 are similar to those of the first supporting portion 170 in the first support 100 and, for brevity, are not described in detail herein.

In a case that the first support 100 includes the first supporting rod 130 and the second supporting rod 140, the first supporting rod 130 and the second supporting rod 140 each may be provided with the first connecting portion 110, so that two opposite ends of the third supporting rod 300 can be connected to the two first connecting portions 110 respectively to improve movement stability of the third support 300.

Optionally, the first connecting portion 110 is disposed on a side of the first supporting rod 130 facing the second supporting rod 140. In this case, the third support 300 can be located between the first supporting rod 130 and the second supporting rod 140, so that the number of exposed structural members in the support structure can be reduced, which reduces a probability of damage to the support structure; and the number of gaps between the support structure and the outside can be reduced, which further prevents external impurities from entering the support structure.

In a case that the first supporting rod 130 and the second supporting rod 140 are both provided with the first connecting portion 110, one first connecting portion 110 may be located on a surface of the first supporting rod 130 facing the second supporting rod 140, and the other first connecting portion 110 may be located on a surface of the second supporting rod 140 facing the first supporting rod 130.

Correspondingly, the second support 200 may also be provided with two second connecting portions 210, which may be provided on a side of the third supporting rod 230 facing the fourth supporting rod 240 and a side of the fourth supporting rod 240 facing the third supporting rod 230 respectively, so that two opposite ends of the third support 300 can be connected to the two second connecting portions 210 respectively.

Based on the foregoing embodiment, in a case that the first connecting portion 110 is located on the side of the first supporting rod 130 facing the second supporting rod 140, the first connecting portion 110 may also be located at an end of the first supporting rod 130 close to the second support 200. In this way, an overall size of the third support 300 is reduced, and in the process of folding and unfolding the support structure, no gap of a large size appears between the first support 100 and the second support 200, so that an overall size of the support structure in a folded state is relatively small, which further improves portability of the support structure and the electronic device.

Correspondingly, in a case that the second connecting portion 210 is located on the side of the third supporting rod 230 facing the fourth supporting rod 240, the second connecting portion 210 may also be located at an end of the third supporting rod 230 close to the first support 100.

Optionally, the third support 300 is a plate-like structure, and the third support 300 may be supported on the first connecting portion 110 and the second connecting portion 210. In this way, during the rotation of the first connecting portion 110 and the second connecting portion 210 relative to each other about the axis of rotation, even if the first connecting portion 110 and the second connecting portion 210 move relative to each other, it can be ensured that the third support 300 can move relative to the first connecting portion 110 and the second connecting portion 210, so that the third support 300 can be stably supported on the first connecting portion 110 and the second connecting portion 210.

Figure 12:
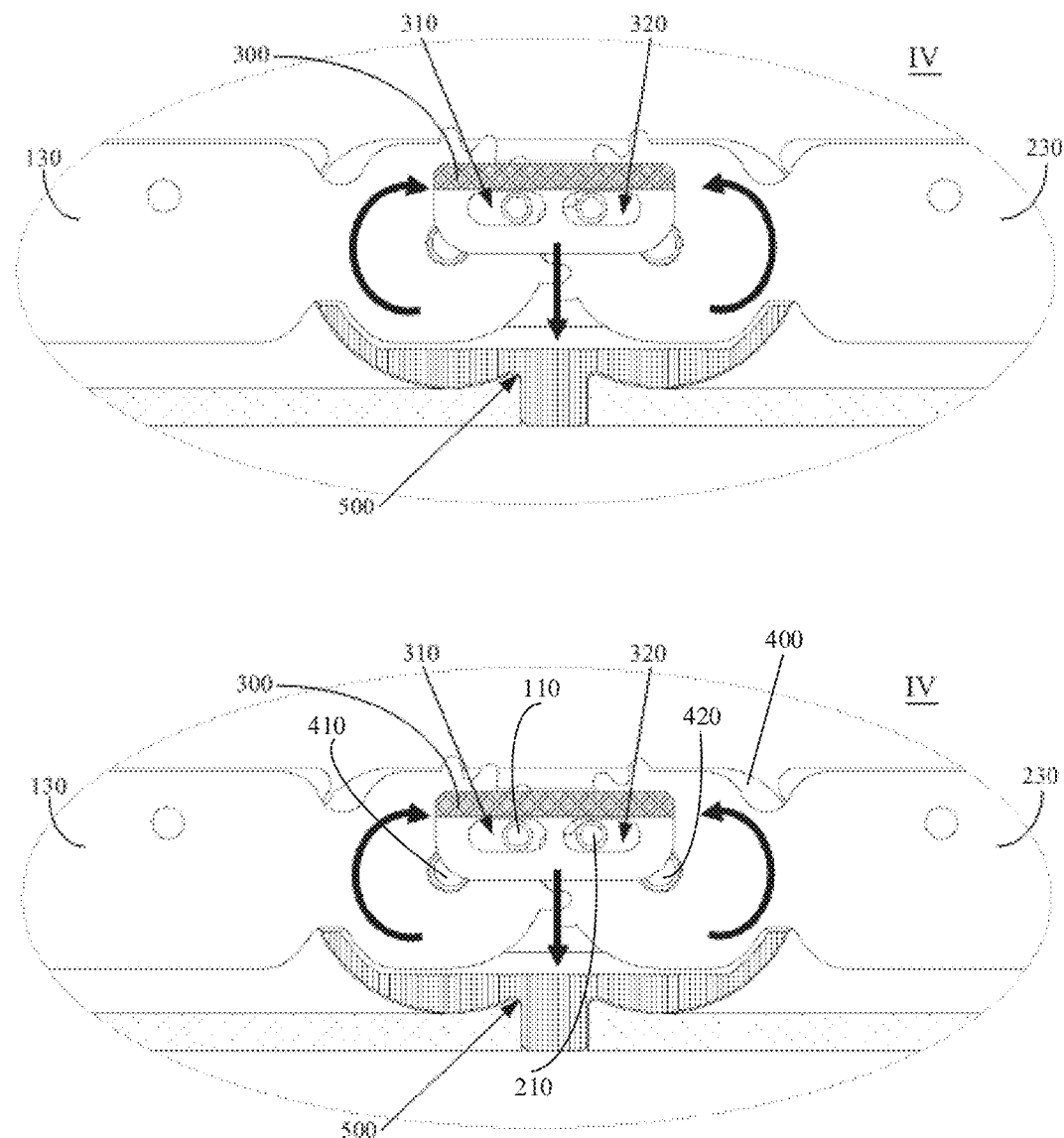
FIG. 12 is an enlarged view of part IV in FIG. 11.
Figure 13:
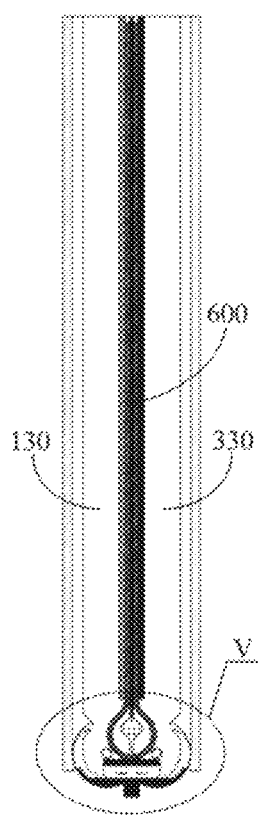
FIG. 13 is a schematic diagram of a display assembly in a folded state according to an embodiment of the present disclosure.
Figure 14:
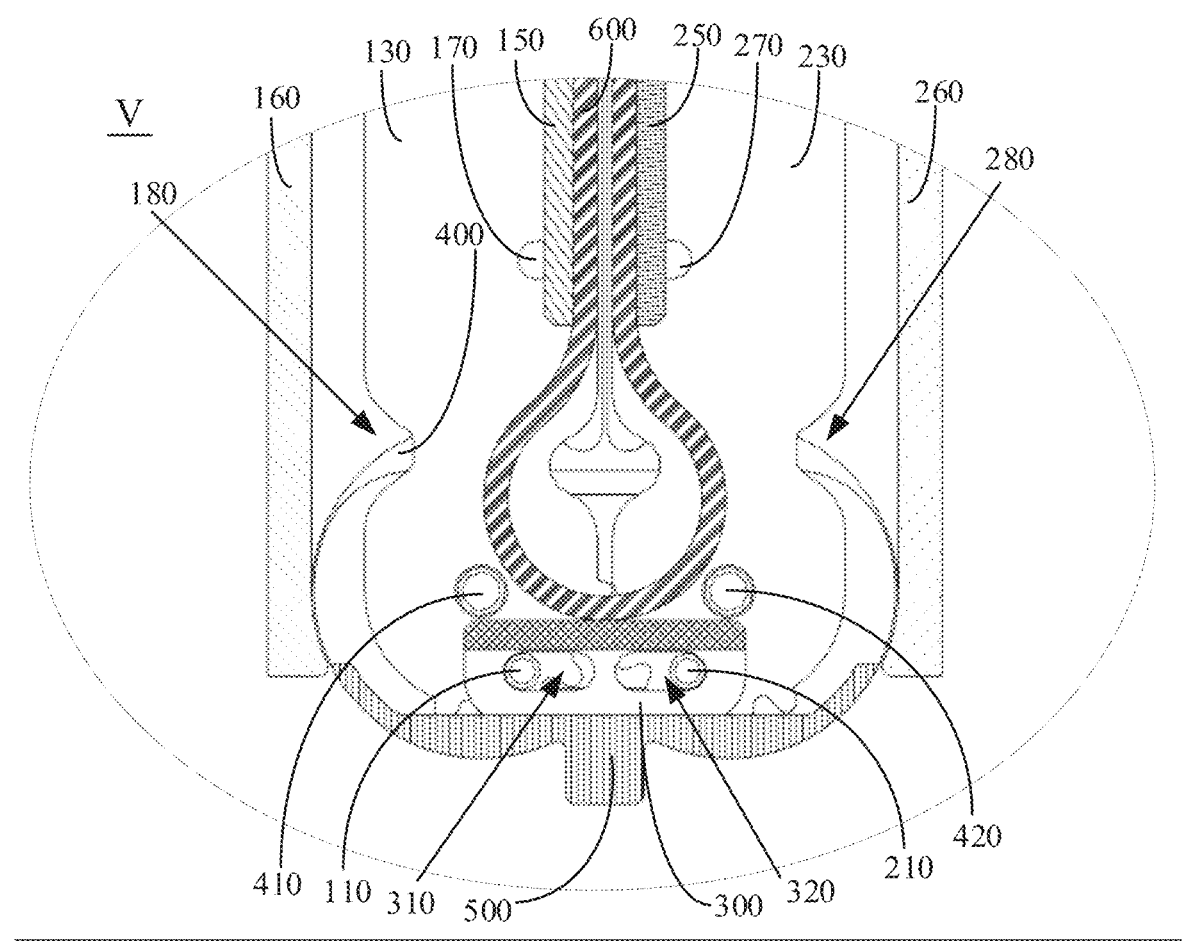
FIG. 14 is an enlarged view of part V in FIG. 13.

In another embodiment of the present disclosure, as shown in FIG. 12, the third support 300 is provided with a first slot for moving 310, and the first connecting portion 110 is inserted into the first slot for moving 310. In a direction perpendicular to the axis of rotation, the first connecting portion 110 may movably fit with the first slot for moving 310, so that the third support 300 can move relative to the first connecting portion 110.

In addition, in a case that the first supporting rod 130 and the second supporting rod 140 are both provided with the first connecting portion 110, and the two opposite ends of the third support 300 are inserted into the two first connecting portions 110 respectively, the first supporting rod 130 and the second supporting rod 140 can provide a limiting effect for the third support 300 in the direction of the axis of rotation, and the two first connecting portions 110 can provide a limiting effect for the third support 300 in the direction perpendicular to the axis of rotation, so that movement stability of the third support 300 is relatively high.

Alternatively, a size of the first slot for moving 310 may be determined based on parameters such as a size and a movement range of the first connecting portion 110. Since the first connecting portion 110 rotates relative to the first slot for moving 310 during the rotation about the axis of rotation. Optionally, the first connecting portion 110 may be a cylindrical structure. When such a structure is used, the first slot for moving 310 may be provided as a waist-shaped hole. In addition, a radius of the waist-shaped hole only needs to be slightly greater than that of the first connecting portion 110 to ensure that the first connecting portion 110 can rotate relative to the first slot for moving 310. The overall structural strength of the third support 300 is relatively high with the size of the waist-shaped hole being relatively small.

In addition, because the second connecting portion 210 is also connected to the third support 300, in a case that the first slot for moving 310 is provided at an end of the third support 300, a second slot for moving 320 needs to be further provided so that the second connecting portion 210 can movably fit with the second slot for moving 320.

Alternatively, in a case that the first slot for moving 310 is a waist-shaped hole, the second slot for moving 320 may be a circular hole. In this case, the second connecting portion 210 may also be a circular structural member, and the second connecting portion 210 is inserted into the circular hole, so that during the relative movement of the first connecting portion 110 and the second connecting portion 210, the third support 300 moves along with the movement of the second connecting portion 210. A change of a distance between the first connecting portion 110 and the second connecting portion 210 can be compensated only by the first slot for moving 310 fitting with the first connecting portion 110 to ensure that the first connecting portion 110 and the second connecting portion 210 can normally drive the third support 300 to move.

In another embodiment of the present disclosure, the first slot for moving 310 and the second slot for moving 320 are both waist-shaped holes. In this case, because the third support 300 can move relative to the first connecting portion 110 and can also move relative to the second connecting portion 210, during the relative movement of the first connecting portion 110 and the second connecting portion 210, a position of the third support 300 can be kept unchanged in a direction of a connecting line between the first connecting portion 110 and the second connecting portion 210. This prevents a gap between the third support 300 and the first support 100 or the second support 200 from being too large to adversely affects air tightness of the support structure and other performance. In addition, this can also prevent the third support 300 from moving toward the first support 100 or the second support 200 in the above-mentioned direction for an excessively large distance to cause the third support 300 to collide with the first support 100 or the second support 200 and damage the support structure.

Further, the support structure disclosed in this embodiment of the present disclosure may further include an end cover 400 provided with a first rotating shaft 410 and a second rotating shaft 420. The first rotating shaft 410 and the second rotating shaft 420 both extend in the direction of the axis of rotation. The first support 100 is hinged to the first rotating shaft 410, and the second support 200 is hinged to the second rotating shaft 420. With connection of the end cover 400, stability and reliability during the relative rotation between the first support 100 and the second support 200 can be further improved. In addition, two end covers 400 may be provided, which are disposed on two opposite sides of the first support 100 respectively, that is, the two end covers 400 are located outside the first supporting rod 130 and the second supporting rod 140 respectively. The two end covers 400 may be connected to the mounting base such as a housing, so as to ensure high connection reliability between the end covers 400 and the first support 100 and the second support 200.

Alternatively, the first support 100 and the second support 200 each may be provided with a fitting hole. The first support 100 can be hinged onto the end cover 400 by inserting the first rotating shaft 410 into the fitting hole of the first support 100. The second support 200 can be hinged onto the end cover 400 by inserting the second rotating shaft 420 into the fitting hole of the second support 200.

Correspondingly, the end cover 400 may further be provided with the second rotating shaft 420, and the second support 200 is hinged to the second rotating shaft 420, so as to further improve fitting stability between the first support 100 and the second support 200.

In a case that the two end covers 400 are disposed on the two opposite sides of the first support 100 (and/or the second support 200) respectively, optionally, the support structure disclosed in this embodiment of the present disclosure may further include a base 500. The two end covers 400 are connected to each other by means of the base 500, so that fitting relationship between the two end covers 400 and the first support 100 and the second support 200 is more stable.

In addition, the base 500 is disposed on a side of the first support 100 away from the first supporting surface. The base 500 is connected to the first support 100 and the second support 200 and can provide a more comprehensive coating effect for the display screen disposed on a side of the first supporting surface and the second supporting surface. In addition, the base 500 can provide some protection for the third support 300, so that movable components of the entire support structure are not exposed as much as possible, thereby prolonging service life of the support structure.

Further, the base 500 includes a main body portion 510, a first limiting portion 520, and a second limiting portion 530. The first limiting portion 520 is connected to one side of the main body portion 510, and the second limiting portion 530 is connected to the other side of the main body portion 510. The first limiting portion 520 and the second limiting portion 530 are both arc-shaped structural members. A side of the first support 100 away from the first supporting surface is provided with a first limiting groove 180, and a side of the second support 200 away from the second supporting surface is provided with a second limiting groove 280. In a case that the support structure is in an unfolded state, the first limiting portion 520 extends into the first limiting groove 180 and fits with the first support 100 at a limited position, and the second limiting portion 530 extends into the second limiting groove 280 and fits with the second support 200 at a limited position.

After the foregoing structure is used, when the support structure is in an unfolded state, the base 500 can be mutually limited with the first support 100 and the second support 200. In addition, the first limiting portion 520 extends in a direction approaching the first supporting surface, and the first limiting portion 520 is an arc-shaped structural member; and the second limiting portion 530 extends in a direction approaching the second supporting surface, and the second limiting portion 530 is an arc-shaped structural member. Therefore, when the support structure is in a folded state, the first limiting portion 520 can coat the first support 100, and the second limiting portion 520 can coat the second support 200. Further, the first support 100, the first limiting portion 520, the main body portion 510, the second limiting portion 530, and the second support 200 can coat the display screen and the third support 300 to prevent the display screen and the third support 300 from being damaged due to an exposed part when a bump occurs.

In a case that the base 500 is provided, optionally, the base 500 may also include the main body portion 510 and a third limiting portion 540. The third limiting portion 540 is connected to the main body portion 510 and is disposed on a side of the main body portion 510 away from the first supporting surface. When the support structure is in an unfolded state, the third limiting portion 540 is sandwiched between the first support 100 and the second support 200.

When the foregoing structure is used, in the process of switching the support structure from the folded state to the unfolded state, endpoint positions of the first support 100 and the second support 200 during the rotation can be limited by the third limiting portion 540 to prevent the first support 100 and the second support 200 from an excessive rotation that damages the display screen connected to the support structure. Alternatively, the third limiting portion 540 and the main body portion 510 may be formed integrally, the third limiting portion 540 is located on an outer periphery of the main body portion 510, and an angle spanned by the third limiting portion 540 may be determined depending on actual needs.

In addition, the base 500 may include the main body portion 510, the first limiting portion 520, the second limiting portion 530, and the third limiting portion 540. The first limiting portion 520, the second limiting portion 530, and the third limiting portion 540 are all connected onto the main body portion 510, and the first limiting portion 520 and the second limiting portion 530 are located on two opposite sides of the third limiting portion 540 respectively. The respective shapes and position relationships of the first limiting portion 520, the second limiting portion 530, and the third limiting portion 540 have been clearly described above, and details are not repeated here.

Optionally, the support structure may further include a first housing 160 and a second housing 260. The first housing 160 is mounted on a side of the first support 100 away from the first supporting surface, and the first housing 160 can provide protection for other components mounted in the first support 100. The second housing 260 is mounted on a side of the second support 200 away from the second supporting surface, and the second housing 260 can provide protection for other components mounted in the second support 200. Alternatively, the first housing 160 and the second housing 260 both may be made of hard materials such as metal, and their sizes and specific shapes may be determined according to corresponding sizes of the first support 100 and the second support 200.

Based on the support structure disclosed in the foregoing embodiment, an embodiment of the present disclosure further discloses a display assembly. The display assembly includes a display screen and the support structure disclosed in any one of the foregoing embodiments, and the display screen is mounted onto the support structure. As described above, the display screen may be an integral flexible display 600. In this case, part of the flexible display 600 is fixedly connected to the third support 300, so that the flexible display 600 can deform along with the movement of the third support 300 in the process of folding and unfolding the display assembly. In addition, part of the structure of the flexible display 600 can extend into between the first supporting surface and the third supporting surface and between the second supporting surface and the third supporting surface through deformation, preventing the flexible screen 600 from being creased in the process of being folded.

Alternatively, the display screen may include the flexible display 600, a first rigid display, and a second rigid display, and the first rigid display and the second rigid display may be connected to two opposite sides of the flexible display 600 respectively to form the entire display screen. In this case, the first rigid display may be supported on the first supporting surface, the second rigid display may be supported on the second supporting surface, the flexible display 600 may be supported on the third supporting surface, and part of the flexible display 600 may be connected to the third supporting surface. Similarly, the flexible display 600 can also deform along with the movement of the third support 300, and part of the structure of the flexible display 600 can extend into between the first supporting surface and the third supporting surface and between the second supporting surface and the third supporting surface through deformation, preventing the flexible screen 600 from being creased in the process of being folded.

Based on the display assembly disclosed in the foregoing embodiment, an embodiment of the present disclosure further discloses an electronic device. The electronic device includes the display assembly disclosed in the foregoing embodiment. Certainly, the electronic device may further include a battery and other components, and the display assembly may be connected to the battery. The structure composition and connection relationship of the display assembly including the support structure and the display screen have been described in detail based on the foregoing description, and for brevity, details are not repeated here.

The electronic device disclosed in this embodiment of the present disclosure may be a smart phone, a tablet computer, an e-book reader, or a wearable device. Certainly, the electronic device may alternatively be other devices, which is not limited in the embodiments of the present disclosure.

The foregoing embodiments of the present disclosure focus on the differences between the embodiments. As long as the different features of improvement in the embodiments are not contradictory, they can be combined to form a more preferred embodiment. For brevity, details are not repeated here.

The foregoing descriptions are merely embodiments of the present disclosure and are not intended to limit the present disclosure. For a person skilled in the art, the present disclosure may have various changes and variations. Any modification, equivalent replacement, improvement, or the like made without departing from the spirit and principle of the present disclosure shall fall within the scope of claims of the present disclosure.

What is claimed is:

1. A support structure, comprising: a first support having a first supporting surface and provided with a first connecting portion; a second support rotatably fitting with the first support about an axis of rotation, wherein the second support has a second supporting surface and is provided with a second connecting portion, and the first connecting portion and the second connecting portion are both spaced apart from the axis of rotation; and a third support having a third supporting surface and rotatably connected to both the first connecting portion and the second connecting portion, a flexible display is mounted onto the support structure, and part of the flexible display is fixedly connected to the third support, wherein when the support structure is in a folded state, the first supporting surface and the second supporting surface are spaced apart from the third supporting surface, and the first supporting surface and the second supporting surface each form a specific included angle with the third supporting surface, wherein the third support is provided with a first slot for moving and a second slot for moving; the first connecting portion is inserted into the first slot for moving, and the first connecting portion is movable relative to the first slot for moving; and the second connecting portion is inserted into the second slot for moving, and the second connecting portion is movable relative to the second slot for moving, wherein the first slot for moving is a waist-shaped hole, and the second slot for moving is a waist-shaped hole or a circular hole; and the support structure further comprises an end cover provided with a first rotating shaft and a second rotating shaft, the first rotating shaft and the second rotating shaft both extend along the axis of rotation, the first rotating shaft is hinged to the first support, and the second rotating shaft is hinged to the second support; and the support structure further comprises a base, there are two end covers disposed on two opposite sides of the first support respectively and connected by means of the base, and the base is disposed on a side of the first support away from the first supporting surface; and the base comprises a main body portion, a first limiting portion, and a second limiting portion, the first limiting portion and the second limiting portion are both connected to the main body portion and are located on two opposite sides of the main body portion respectively, the first limiting portion and the second limiting portion are both arc-shaped structural members, a side of the first support away from the first supporting surface is provided with a first limiting groove, a side of the second support away from the second supporting surface is provided with a second limiting groove, and when the support structure is in an unfolded state, the first limiting portion extends into the first limiting groove and fits with the first support at a limited position, and the second limiting portion extends into the second limiting groove and fits with the second support at a limited position; and the base comprises a third limiting portion, the third limiting portion is protruded from a side of the main body portion away from the first supporting surface, and when the support structure is in an unfolded state, the first support and the second support engage opposite sides of the third limiting portion.

2. The support structure according to claim 1, wherein an outer edge of the first support is provided with a plurality of first gear teeth, an outer edge of the second support is provided with a plurality of second gear teeth, and the first support rotatably fits with the second support via engagement of the first gear teeth and the second gear teeth.

3. The support structure according to claim 1, wherein the first support comprises a first supporting rod, a second supporting rod, and a first supporting plate, the first supporting rod is spaced apart from the second supporting rod, the first supporting rod and the second supporting rod are both provided with the first connecting portion, each of the first connecting portions rotatably connected to the third support, the first supporting rod and the second supporting rod are both connected to the first supporting plate, and the first supporting plate has the first supporting surface; and the second support comprises a third supporting rod, a fourth supporting rod, and a second supporting plate, the third supporting rod is spaced apart from the fourth supporting rod, the third supporting rod and the fourth supporting rod are both provided with the second connecting portion, each of the second connecting portions rotatably connected to the third support, the third supporting rod and the fourth supporting rod are both connected to the second supporting plate, and the second supporting plate has the second supporting surface.

4. The support structure according to claim 3, wherein a side wall of at least one of the first supporting rod or the second supporting rod is provided with a first supporting portion, and the first supporting plate is supported on the first supporting portion; and a side wall of at least one of the third supporting rod or the fourth supporting rod is provided with a second supporting portion, and the second supporting plate is supported on the second supporting portion.

5. The support structure according to claim 3, wherein the first connecting portion is located on a side of the first supporting rod facing the second supporting rod; and the second connecting portion is located on a side of the third supporting rod facing the fourth supporting rod.

6. The support structure according to claim 5, wherein the first connecting portion is located at an end of the first supporting rod close to the second support, and the second connecting portion is located at an end of the third supporting rod close to the first support.

7. The support structure according to claim 1, wherein the support structure further comprises a first housing and a second housing, the first housing is mounted on a side of the first support away from the first supporting surface, and the second housing is mounted on a side of the second support away from the second supporting surface.

8. The support structure according to claim 1, wherein when the support structure is in an unfolded state, the first supporting surface, the second supporting surface, and the third supporting surface are coplanar.

9. A display assembly, comprising a flexible display and the support structure according to claim 2, wherein the flexible display is mounted onto the support structure, and part of the flexible display is fixedly connected to the third support.

10. A display assembly, comprising a flexible display and the support structure according to claim 3, wherein the flexible display is mounted onto the support structure, and part of the flexible display is fixedly connected to the third support.

11. An electronic device, comprising the display assembly according to claim 1.

12. An electronic device, comprising a flexible display and the support structure according to claim 5, wherein the flexible display is mounted onto the support structure, and part of the flexible display is fixedly connected to the third support.

13. An electronic device, comprising a flexible display and the support structure according to claim 6, wherein the flexible display is mounted onto the support structure, and part of the flexible display is fixedly connected to the third support.

14. An electronic device, comprising a flexible display and the support structure according to claim 1, wherein the flexible display is mounted onto the support structure, and part of the flexible display is fixedly connected to the third support.

* * * * *